United States Patent [19]

Miyawaki et al.

[11] Patent Number: 5,260,904
[45] Date of Patent: * Nov. 9, 1993

[54] DATA BUS CLAMP CIRCUIT FOR A SEMICONDUCTOR MEMORY DEVICE

[75] Inventors: Masahumi Miyawaki; Tamihiro Ishimura; Yoshio Ohtsuki, all of Tokyo, Japan

[73] Assignee: Oki Electric Industry Co., Ltd., Japan

[ * ] Notice: The portion of the term of this patent subsequent to Feb. 25, 2009 has been disclaimed.

[21] Appl. No.: 797,954

[22] Filed: Nov. 26, 1991

Related U.S. Application Data

[63] Continuation of Ser. No. 706,206, May 28, 1991, Pat. No. 5,091,886.

[30] Foreign Application Priority Data

May 31, 1990 [JP] Japan .................. 2-142664

[51] Int. Cl.$^5$ .................................. G11C 7/00
[52] U.S. Cl. .................. 365/189.06; 365/204; 365/208; 365/230.06; 365/230.08; 365/233
[58] Field of Search ............ 365/189.06, 230.06, 365/230.08, 203, 204, 207, 208, 233

[56] References Cited

U.S. PATENT DOCUMENTS

| 4,494,222 | 1/1985 | White et al. ............ 365/230.08 |
| 4,636,986 | 1/1987 | Pinkham ................ 365/230.08 |
| 4,809,230 | 2/1989 | Konishi et al. ........... 365/204 |
| 4,961,168 | 10/1990 | Tran ................... 365/189.06 |
| 4,985,868 | 1/1991 | Nakano et al. .......... 365/230.08 |
| 5,083,296 | 1/1992 | Hara et al. ............. 365/230.08 |
| 5,091,886 | 2/1992 | Miyawaki et al. ......... 365/204 |

FOREIGN PATENT DOCUMENTS 0184148  6/1985  European Pat. Off. .
0178921  4/1986  European Pat. Off. .

Primary Examiner—Joseph E. Clawson, Jr.
Attorney, Agent, or Firm—Spencer, Frank & Schneider

[57] ABSTRACT

A data bus clamping circuit for use in a semiconductor memory device includes a memory cell array for storing data, a row address decoder for decoding row address signals taken in by a row address strobe signal to select memory cells in a row direction of the memory cell array, a column address decoder for decoding column address signals based on a column address decoder enabling signal to select memory cells in a column direction of the memory cell array, complementary data buses for transmitting data read out from the memory cell array, a data bus pull-up circuit for pulling up the complementary data buses, and a differential amplification type of readout circuit for amplifying on a differential basis data on the complementary data buses to output readout data. The data bus clamping circuit includes a first discharge circuit for discharging electric charge on the complementary data buses during an active period of the row address strobe signal, and a second discharge circuit for discharging electric charge on the complementary data buses with a discharge ability larger than the first discharge circuit, during a period of time from the time the active period of the row address strobe signal starts until the column address decoder enabling signal becomes active.

15 Claims, 7 Drawing Sheets

DATA BUS CLAMP CIRCUIT FOR A SEMICONDUCTOR MEMORY DEVICE

This is a continuation of application Ser. No. 07/706,206 filed May 28, 1991 now U.S. Pat. No. 5,091,886.

BACKGROUND OF THE INVENTION

1. Field of the Invention

The present invention relates to a data bus clamping circuit in a semiconductor memory device such as a dynamic RAM (Random Access Memory) capable of reading out data on a data bus at high speed, independently of variation in a power supply voltage, with a differential amplification type of read out circuit.

2. Description of the Prior Art

FIGS. 5A and 5B show conventional data bus clamping circuits used, for instance, in a semiconductor memory device as shown in FIG. 2, which will be explained later in detail.

The data bus clamping circuit of FIGS. 5A and 5B comprises N channel type of MOS transistor (referred to as NMOS's hereinafter) 61, 62, 63 and 64 which are extremely small in mutual conductance. NMOS's 61 and 62 are connected in series between a data bus DB and a ground potential VSS. NMOS's 63 and 64 are connected in series between a data bus $\overline{DB}$ and the ground potential VSS. NMOS's 61 and 63 are operative to turn on and off in response to a row address latch signal RAS. When NMOS's 61 and 63 turn on, NMOS's 62 and 64 are operative to turn on.

FIG. 6 is a view showing operational wave forms at the time when data are read out by the data bus clamping circuits of FIGS. 5A and 5B. Now referring to FIG. 6, a readout operation for memory cell array 10 shown in FIG. 2 will be explained hereinafter.

(1) Standby period Ta

In FIG. 6, during a standby period Ta wherein a row address strobe signal $\overline{RAS}$ is given with a high level (referred to as "H" hereinafter), the row address latch signal RAS is in level VSS, both sense amplifier enabling signals SAP and SAN are in ½ VCCH (power supply voltage), a column address decoder enabling signal YDE and a column decoding signal YD are in VSS, and bit lines BL and $\overline{BL}$ are in ½ VCCH.

When the row address latch signal RAS is in level VSS, NMOS's 61 and 63 in the data bus clamping circuits of FIGS. 5A and 5B are in a turn-off condition. On the other hand, in a data bus pull-up circuit 50, a circuit structure of which is shown in FIGS. 4A and 4B, NMOS's 51 and 52 each having a threshold voltage Vt are in a turn-on condition, and thus the data buses DB and $\overline{DB}$ are (VCCH−Vt) in the potential.

(2) Active period Tb

When transition of the row address strobe signal $\overline{RAS}$ to a low level (referred to as "L" hereinafter) occurs at time t1 in FIG. 6, the row address latch signal RAS becomes VCCH. When the row address latch signal RAS becomes VCCH, a row direction of the memory cell array 10 is selected by a row address decoder 20, so that data on the selected memory cells are read out on the bit lines BL and $\overline{BL}$.

On the other hand, when the row address latch signal RAS changes in level from VSS to VCCH after transition of the row address strobe signal $\overline{RAS}$ to "L", NMOS's 61 to 64 in the data bus clamping circuits of FIGS. 5A and 5B changes to a turn-on condition. Consequently, electric charge on the data buses DB and $\overline{DB}$ is discharged, and thus potentials of the data buses DB and $\overline{DB}$ are determined between VCCH and VSS based on the resistive divisional ratio of the turn-on resistance of NMOS's 51 and 52 in the data bus pull-up circuit 50 to the turn-on resistance of NMOS's 61 to 64 in the data bus clamping circuits of FIGS. 5A and 5B.

At time t2, if the power supply voltage is changed from VCCH to VCCL (for example 4 to 5 volt), the electric change on the data buses DB and $\overline{DB}$ is discharged by the data bus clamping circuits of FIGS. 5A and 5B.

At time t3, after the data on the memory cells are read out on the bit lines BL and $\overline{BL}$, the sense amplifier enabling signal SAP changes in level from ½ VCCH to VCCL and the sense amplifier enabling signal SAN changes in level from ½ VCCH to VSS. Those transitions of potential level cause a sense amplifier circuit 30 to amplify a minute potential difference ΔV between the bit lines BL and $\overline{BL}$.

At time t4, when the column address decoder enabling signal YDE changes in level from VSS to VCCL, a column address signal YADn is selected by a certain column address decoder 40 selected in VCCL, and the column decoding signal YD changes in level from VSS to VCCL. When the column decoding signal YD changes in level from VSS to VCCL, NMOS's 43 and 44 in the column address decoder 40 become a turn-on condition to transfer data on the bit lines BL and $\overline{BL}$ to the data bus DB and $\overline{DB}$. As a result, there is produced a potential difference corresponding to the bit line data between the complementary data bus DB and $\overline{DB}$. Such a potential difference is amplified by a differential amplification type of readout circuit 70, and then is output as a readout data DOUT.

(3) Standby period Tc

At time t5, when the row address strobe signal $\overline{RAS}$ changes in level from "L" 0 to "H" to become a standby period Tc, the row address latch signal RAS is in level VSS, so that the data bus clamping circuit of FIG. 5A or 5B turns off. Further, at that time, the column address decoder enabling signal YDE and the column decoding signal YD becomes VSS. Thus, the data bus DB and $\overline{DB}$ are electrically separated from the data bus clamping circuit and the bit lines BL and $\overline{BL}$, and the data bus DB and $\overline{DB}$ become in potential (VCC−Vt) by the data bus pull-up circuit 50. Further, transition of the row address strobe signal $\overline{RAS}$ from "L" to "H" causes both the sense amplifier enabling signals SAP and SAN to be in ½ VCCL, and also causes both the bit lines BL and $\overline{BL}$ to be in ½ VCCL. Thus a series of reading out operation is terminated.

This type of conventional data bus clamping circuit, however, has been associated with the following drawbacks.

According to the conventional data bus clamping circuit, during the active period Tb shown in FIG. 6, if the power supply potential VCC changes from high potential VCCH to low potential VCCL owing to variation in a power supply, potentials of the data buses DB and $\overline{DB}$ also slowly descend by the data bus clamping circuit. However, since the descent rate in potential is low, the column address decoder 40 is enabled at time t4 in course of the potential descent, so that data on the bit lines BL and $\overline{BL}$ are transferred to the data buses DB and $\overline{DB}$, respectively. Consequently, the differential amplification type of readout circuit 70 cannot amplify at high speed the data thus transferred.

The differential amplification type of readout circuit 70 is provided with optimum potential set values VA and VB for a high speed amplification. Whereas, at time t in FIG. 6, when the differential amplification type of readout circuit 70 starts an amplification operation, the potentials of the data buses DB and $\overline{DB}$ have not descended up to the optimum potential set values VA and VB, respectively. Accordingly, the differential amplification type of readout circuit 70 can not amplify at high speed the data on the data buses DB and $\overline{DB}$. Thus, the conventional data bus clamping circuit has been associated with such a problem that the readout speed of data slows.

In order to solve this problem, it may be considered that the potentials of the data buses DB and $\overline{DB}$ are clamped at high speed by the data bus clamping circuit. Whereas, when the column address decoder 40 is enabled, so that the bit lines BL and $\overline{BL}$ and the data buses DB and $\overline{DB}$ become conductive conditions, respectively, a current of the sense amplifier enabling signal SAP flows through P channel type of MOS transistor (referred to as PMOS hereinafter) 34 in the sense amplifier 30, NMOS 44 in the column address decoder 40 and NMOS's 63 and 64 in the data bus clamping circuits in FIGS. 5A and 5B to the earth potential VSS.

The increasing of such a current brings drawbacks such as deterioration of the transistors as well as an increase of an amount of consumption current. Thus, according to the conventional data bus clamping circuit, the mutual conductance of NMOS's 61-64 is set to be small. In other words, a large turn-on resistance is provided the decrease of such a current. Consequently, it is impossible to clamp the potentials of the data buses DB and $\overline{DB}$ at high speed by the data bus clamping circuit, and thus impossible to solve the problem which the conventional device encounters.

SUMMARY OF THE INVENTION

It is therefore an object of the present invention to provide a data bus clamping circuit for use in a semiconductor memory device in accordance with which the foregoing problems have been solved.

According to the present invention there is provided a data bus clamping circuit for use in such a type of semiconductor memory device comprising a memory cell array for storing data, a row address decoder for decoder row address signals taken in by a row address strobe signal to select memory cells in a row direction of the memory cell array, a column address decoder for decoding column address signals based on a column address decoder enabling signal to select memory cells in a column direction of the memory cell array, complementary data buses for transmitting data read out from said memory cell array, a data bus pull-up circuit for pulling up the complementary data buses, and a differential amplification type of readout circuit for amplifying on a differential basis data on the complementary data buses to output readout data. The data bus clamping circuit includes a first discharge circuit for discharging electric charge on the complementary data buses during an active period of the row direction strobe signal, and a second discharge circuit for discharging electric charge on the complementary data buses with a discharge ability larger than the first discharge circuit, during a period of time from the time the active period of the row address strobe signal starts until the column address decoder enabling signal becomes active.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 2:
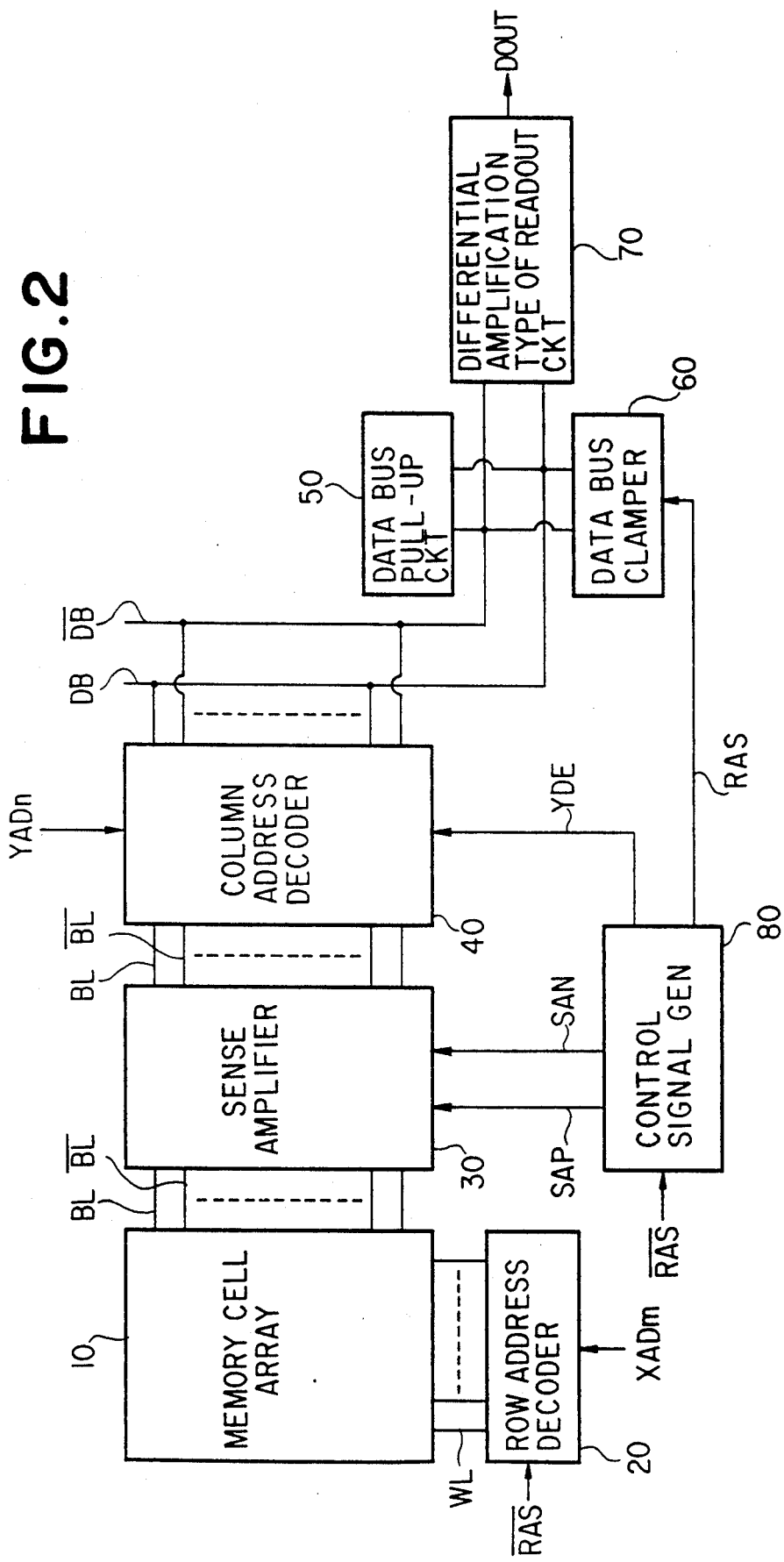
FIG. 2 is a block diagram showing exemplarily a semiconductor memory device to which the data bus clamping circuit according to the present invention is applicable.

FIG. 2 shows exemplarily a semiconductor memory device such as a dynamic RAM (Random Access Memory) to which a data bus clamping circuit according to the present invention is applicable. This semiconductor memory device is provided with a memory cell array 10 in which a large number of memory cells are arranged in a matrix configuration. The memory cell array 10 is coupled through a plurality of word lines WL with a row address decoder 20, and further coupled through a plurality of complementary bit lines BL and $\overline{BL}$ with a sense amplifier 30 and a column address decoder 40. The column address decoder 40 is connected to a plurality of complementary data buses DB and $\overline{DB}$.

The row address decoder 20 decodes a plurality of row address signals XADm taken in by a row address strobe signal $\overline{RAS}$ to select memory cells in a row direction of the memory cell array 10 through the word lines WL. The sense amplifier 30 amplifies readout data on the bit lines BL and $\overline{BL}$, based on sense amplifier enabling signals SAP and SAN. The column address decoder 40 decodes a plurality of column address signals YADn based on a column address decoder enabling signal YDE to select memory cells in a column direction of the memory cell array 10.

Connected to the complementary data buses DB and $\overline{DB}$ are a data bus pull-up circuit 50, a data bus clamping circuit 60 and a differential amplification type of readout circuit 70. The data bus pull-up circuit 50 usually pulls up the data buses DB and $\overline{DB}$. The data bus clamping circuit 60 clamps the data buses DB and $\overline{DB}$ to a predetermined potential based on a row address latch signal RAS. The differential amplification type of readout circuit 70 amplifies on a differential basis a potential difference between the complementary data buses DB and $\overline{DB}$ and outputs readout data DOUT in a MOS level.

This semiconductor memory device is provided with a control signal generating circuit 80 for control of the device. The control signal generating circuit 80 generates, based on the row address strobe signal $\overline{RAS}$, the row address latch signal RAS, the column address decoder enabling signal YDE, and sense amplifier enabling signals SAP and SAN.

Figure 3:
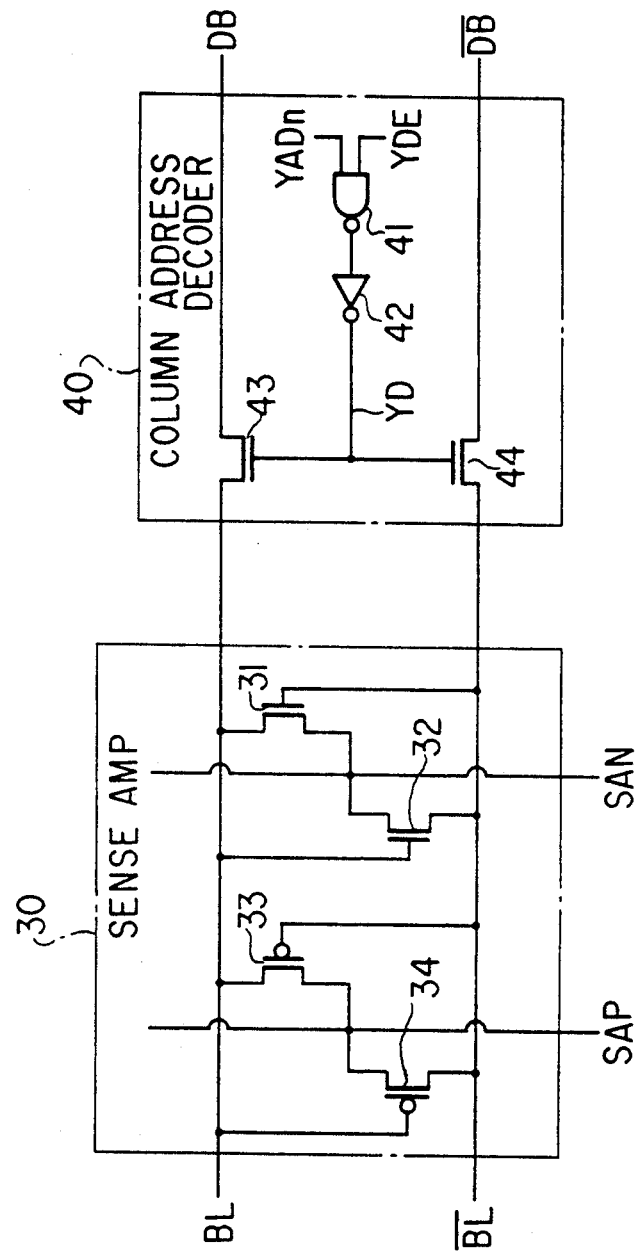
FIG. 3 is a circuit diagram exemplarily showing the structure of the sense amplifier and the column address decoder of the device shown in FIG. 2.

FIG. 3 is a circuit diagram exemplarily showing the structure of the sense amplifier 30 and of the column address decoder 40 in FIG. 2. The sense amplifier 30 is a flip-flop circuit comprising NMOS's 31 and 32 and PMOS's 33 and 34 for amplifying a potential difference between the complementary bit lines BL and $\overline{BL}$. NMOS 31 is connected between the bit line BL and the sense amplifier enabling signal SAN, and its gate is connected to the bit line $\overline{BL}$. NMOS 32 is connected between the bit line $\overline{BL}$ and the sense amplifier enabling signal SAN, and its gate is connected to the bit line BL. PMOS 33 is connected between the bit line BL and the sense amplifier enabling signal SAP, and its gate is connected to the bit line $\overline{BL}$. PMOS 34 is connected between the bit line $\overline{BL}$ and the sense amplifier enabling signal SAP, and its gate is connected to the bit line BL.

The column address decoder 40 includes NAND gate 41 to which the column address signals YADn and the column address decoder enabling signal YDE are entered. An output of NAND gate 41 is connected through an inverter 42 to the respective gates of NMOS's 43 and 44. NMOS's 43 and 44 are operable to turn on or off in accordance with a column decoding signal YD output from the inverter 42, and be connected between the bit line BL and the data bus DB, and between the bit line $\overline{BL}$ and the data bus $\overline{DB}$, respectively.

Figure 4B:
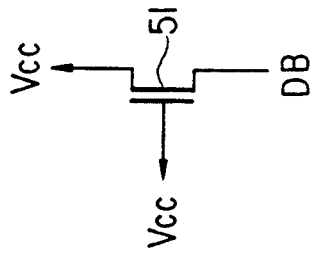
FIGS. 4A and 4B are circuit diagrams exemplarily showing structure of the data bus pull-up circuit in FIG. 2.
Figure 4A:
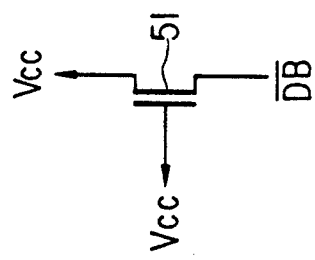

FIGS. 4A and 4B are circuit diagrams exemplarily showing structures of the data bus pull-up circuit 50 in FIG. 2. The data bus pull-up circuit 50 comprises NMOS's 51 and 52 which are small in mutual conductance. A source of NMOS 51 is connected to the data bus $\overline{DB}$. Drain and gate of NMOS 51 are connected to the power supply potential VCC, respectively. Similarly, a source of NMOS 52 is connected to the data bus DB. NMOS has a drain and a gate connected to the power supply potential VCC.

Figure 1:
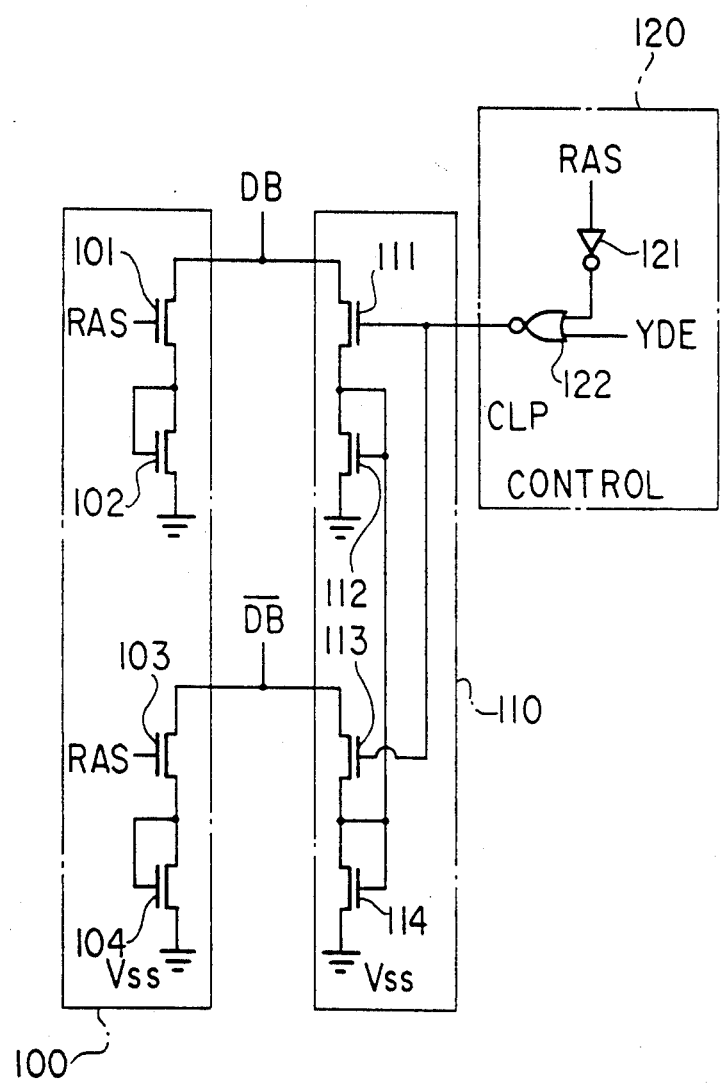
FIG. 1 is a circuit diagram of a data bus clamping circuit as an illustrative embodiment according to the present invention.
Figure 5A:
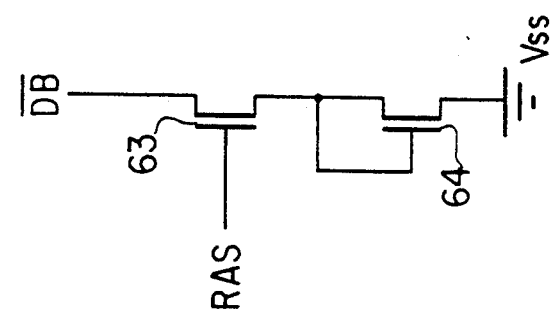
FIGS. 5A and 5B are circuit diagrams of conventional data bus clamping circuits used, for instance, in a semiconductor memory device as shown in FIG. 2.
Figure 5B:
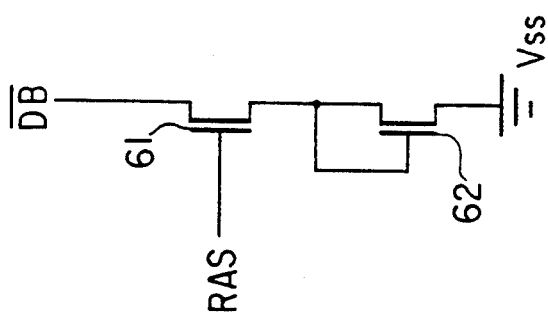
Figure 6:
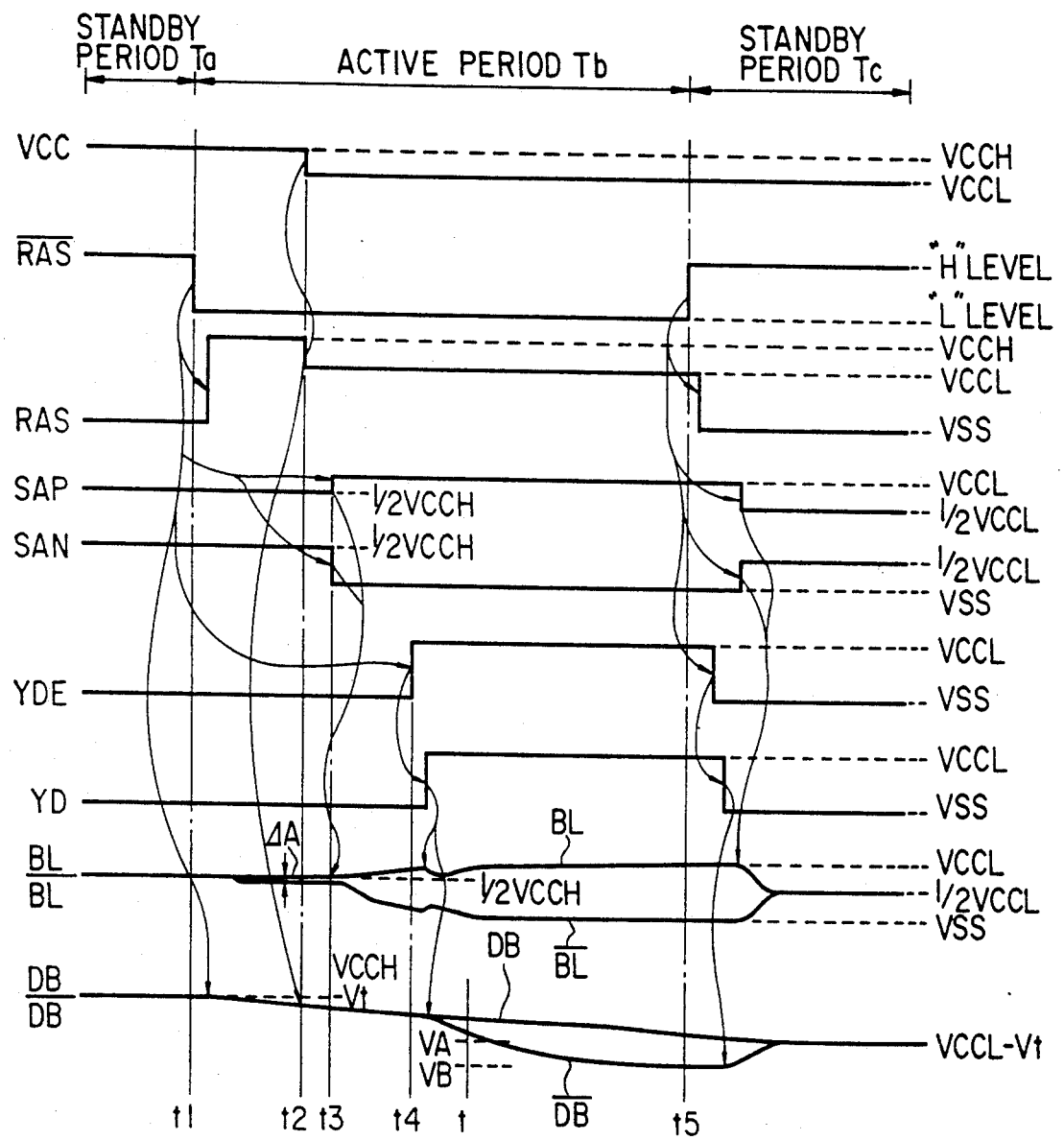
FIG. 6 plots operational waveforms at the time when data are read out by the data bus clamping circuit of FIGS. 5A and 5B.

FIG. 1 is a circuit diagram of a data bus clamping circuit as an illustrative embodiment according to the present invention. This data bus clamping circuit may be substituted for the conventional data bus clamping circuit 60, which has been explained above referring to FIGS. 5A and 5B as prior art.

The data bus clamping circuit in FIG. 1 comprises a first discharge circuit 100 for usually discharging the complementary data buses DB and $\overline{DB}$ in FIG. 2 with a small discharge ability so that the data buses DB and $\overline{DB}$ are clamped, a second discharge circuit 110 for discharging the data buses DB and $\overline{DB}$ with a discharge ability larger than the first discharge circuit 100, during a period of time from the time a standby period is terminated until the time the column address decoder 40 in FIG. 2 is enabled, so that the data buses DB and $\overline{DB}$ are clamped, and a control circuit 120 for controlling an operation of the second discharge circuit 110 by a clamp signal CLP.

The first discharge circuit 100 is provided with NMOS's 101, 102, 103 and 104 which are designed to provide small mutual conductance gm1. Connected to the complementary data bus DB shown in FIG. 2 is a drain electrode of NMOS 101, of which a gate electrode is connected to the row address latch signal RAS shown in FIG. 2. A source electrode of NMOS 101 is connected to drain and gate electrodes of NMOS 102, of which a source electrode is connected to the earth potential VSS. Connected to the other data bus $\overline{DB}$ is a drain electrode of NMOS 103, of which a gate electrode is connected to the row address latch signal RAS. A source electrode of NMOS 103 is connected to drain and gate electrodes of NMOS 104, of which a source electrode is connected to the earth potential VSS.

The second discharge circuit 110 is provided with NMOS's 111, 112, 113 and 114 which are designed to provide relatively large mutual conductance gm2. Connected to the complemental data bus DB is a drain electrode of NMOS 111, of which a gate electrode is connected to the clamp signal CLP and a gate electrode of NMOS 113. A source electrode of NMOS 111 is connected to drain and gate electrodes of NMOS 112, of which a source electrode is connected to the earth potential VSS. The source electrode of NMOS 111 is also connected to drain and gate electrodes of NMOS 114. Connected to the other data bus $\overline{DB}$ is a drain electrode of NMOS 113, of which a source electrode is connected to the drain electrode of NMOS 114.

The mutual conductance gm1 of NMOS's 101, 102, 103 and 104 in the first discharge circuit 100 and the mutual conductance gm2 of NMOS's 111, 112, 113 and 114 in the second discharge circuit 110 are set to be approximately in the ratio 1:10 to 20.

The control circuit 120 for controlling the second discharge circuit 110 comprises an inverter 121 for entering the row address latch signal RAS output from the control signal generating circuit 80 in FIG. 2 and an NOR gate 122 for entering an output of the inverter 121 and the column address decoder enabling signal YDE. The clamp signal CLP output from the NOR gate 122 is supplied to the respective gates of NMOS's 111 and 113 in the second discharge circuit 110.

Figure 7:
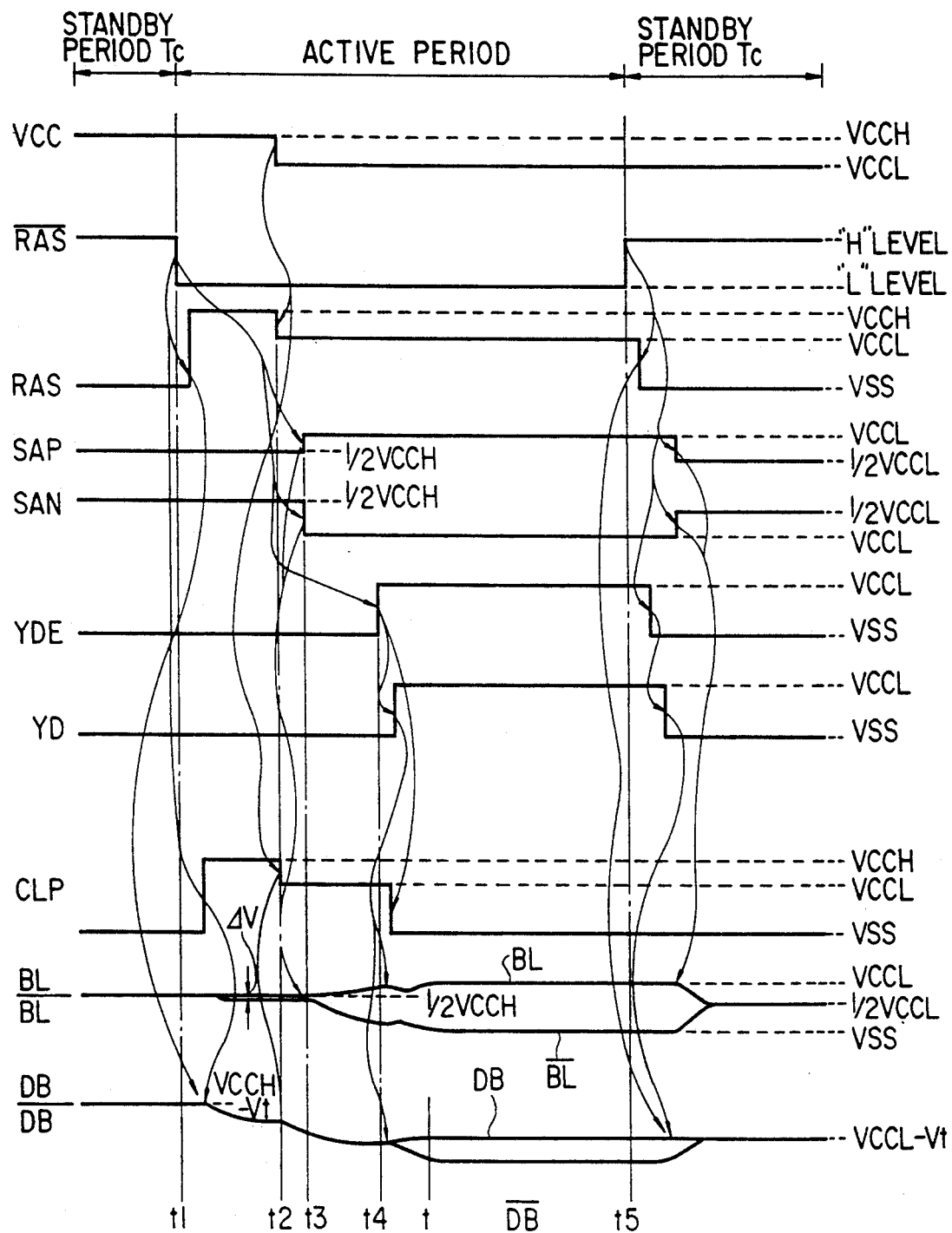
FIG. 7 shows operational waveforms at the time when data are read out by the data bus clamping circuit of FIG. 1.

FIG. 7 shows operational waveforms at the time when data are read out by the data bus clamping circuit of FIG. 1. Now referring to FIG. 7, a readout operation for memory cell array 10 shown in FIG. 2 will be explained hereinafter.

(1) Standby period Ta

In FIG. 7, during a standby period Ta wherein a row address strobe signal $\overline{RAS}$ is given with a high level "H", the row address latch signal RAS, which is opposite in phase to the row address strobe signal $\overline{RAS}$, is in a ground potential VSS, both sense amplifier enabling signals SAP and SAN, which are output from the control signal generating circuit 80, are in ½ VCCH, a column address decoder enabling signal YDE, which is output from the control signal generating circuit 80, is in VSS, a column decoding signal YD in FIG. 3 is in VSS, and the complementary bit lines BL and $\overline{BL}$ are in ½ VCCH.

When the row address latch signal RAS is in level VSS, NMOS's 101–104 in the first discharge circuit 100 shown in FIG. 1 are in a turn-off condition, and also NMOS's 111–114 in the second discharge circuit 110 are in a turn-off condition, since the clamp signal CLP output from the control circuit 120 is in VSS.

On the other hand, in a data bus pull-up circuit 50, a circuit structure of which is shown in FIG. 4, NMOS's 51 and 52 each having a threshold voltage Vt are in a turn-on condition, and thus the data buses DB and $\overline{DB}$ are set to be (VCCH−Vt) in the potential.

(2) Active period Tb

When transition of the row address strobe signal $\overline{RAS}$ from a high level "H" to a low level "L" occurs at a time t1, the row address latch signal RAS, which is output from the control signal generating circuit 80, changes from VSS to VCCH in the level. When the row address latch signal RAS becomes VCCH, a row direction of the memory cell array 10 is selected by a row address decoder 20 in FIG. 2, so that data on the selected memory cells are read out on the bit lines BL and $\overline{BL}$.

On the other hand, when the row address latch signal RAS, which is output from the control signal generating circuit 80, changes in level from VSS to VCCH, based on the row address strobe signal $\overline{RAS}$, NMOS's 101–104 in the first discharge circuit 100 shown in FIG. 1 turn on. Further, when the clamp signal CLP output from the control circuit 120 changes in level from VSS to VCCH, NMOS's 111–114 in the second discharge circuit 110 turn on. Consequently, electric charge on the data buses DB and $\overline{DB}$ is discharged through the first and second discharge circuits 100 and 110, and thus potentials of the data buses DB and $\overline{DB}$ are determined between VCCH and VSS based on the resistive divisional ratio of turn-on resistance of NMOS's 51 and 52 in the data bus pull-up circuit 50 to turn-on resistance of NMOS's 101–104 and 111–114 in the first and second discharge circuits 100 and 110.

For instance, at time t2, if the power supply voltage is changed from VCCH to VCCL, the electric charge on the data buses DB and $\overline{DB}$ is further discharged by the data bus clamping circuit of FIG. 1. The potentials of the data buses DB and $\overline{DB}$ are determined between VCCH and VSS based on the resistive divisional ratio of the turn-on resistance of NMOS's 51 and 52 in the data bus pull-up circuit 50 in FIG. 4 to turn-on resistance of NMOS's 101–104 and 111–114 in the first and second discharge circuits 100 and 110 in FIG. 1.

At time t3, the sense amplifier enabling signal SAP, which is output from the control signal generating circuit 80, changes in level from ½ VCCH to VCCL and the sense amplifier enabling signal SAN changes in level from ½ VCCH to VSS. Those transitions of potential level cause a sense amplifier circuit 30 to amplify a minute potential difference ΔV between the bit lines BL and $\overline{BL}$.

At time t4, when the column address decoder enabling signal YDE, which is output from the control signal generating circuit 80 in FIG. 2, changes in level from VSS to VCCL, the clamp signal CLP, which is output from the control circuit 120 in FIG. 1, changes in level from VSS to VCCL. Thus, NMOS's 111–114 in the second discharge circuit 110 are in a turn-off condition.

When the column address decoder enabling signal YDE changes in level from VSS to VCCL, a column address signal YADn is selected by a certain column address decoder 40 in FIG. 3 selected in VCCL, and the column decoding signal YD changes in level from VSS to VCCL. When the column decoding signal YD changes in level from VSS to VCCL, NMOS's 43 and 44 in the column address decoder 40 become a turn-on condition to transfer data on the bit lines BL and $\overline{BL}$ to the data bus DB and $\overline{DB}$. As a result, produced is a potential difference corresponding to the bit line data between the complementary data bus DB and $\overline{DB}$. Such a potential difference is amplified by a differential amplification type of readout circuit 70, and the output as a readout data DOUT.

(3) Standby period Tc

At time t5, when the row address strobe signal $\overline{RAS}$ changes in level from "L" to "H" to become a standby period Tc, the row address latch signal RAS, which is output from the control signal generating circuit 80 in FIG. 2, is in level VSS, so that NMOS's 101–104 in the first discharge circuit 100 shown in FIG. 1 are in a turn-off condition. Further, at that time, the column address decoder enabling signal YDE and the column decoding signal YD become VSS. Thus, the data buses DB and $\overline{DB}$ are electrically separated from the data bus clamping circuit of FIG. 1 and the bit lines BL and $\overline{BL}$, and the data bus DB and $\overline{DB}$ become in potential (VCC−Vt) by the data bus pull-up circuit 50 shown in FIG. 4. Further, transition of the row address strobe signal $\overline{RAS}$ from "L" to "H" causes both the sense amplifier enabling signals SAP and SAN to be in ½ VCCL, and also causes both the bit lines BL and $\overline{BL}$ to be in ½ VCCL. Thus, a series of readout operation is terminated.

According to the present embodiment, as stated above, the data bus clamping circuit in FIG. 1 comprises first and second discharge circuits 100 and 110, wherein NMOS's 101–104 in the first discharge circuit 100 are designed to provide small mutual conductance gm1, and NMOS's 111–114 of the second discharge circuit 110 are designed to provide relatively large mutual conductance gm2. The second discharge circuit 110 are controlled by the clamp signal CLP output from the control circuit 120 to clamp the data buses DB and $\overline{DB}$ from the time active period Tb starts until the time just before the data on the bit lines BL and $\overline{BL}$ are transferred to the data buses DB and $\overline{DB}$ upon occurrence of transition of the column decoding signal YD in level from VSS to VCCL. This arrangement makes it possible to set the data buses DB and $\overline{DB}$ to an optimum potential which may be amplified at high speed by the differential amplification type of readout circuit 70, thereby providing a high speed data readout.

The second discharge circuit 110 clamps the data buses DB and $\overline{DB}$ from the time active period Tb starts until the time just before the data on the bit lines BL and $\overline{BL}$ are transferred to the data buses DB and $\overline{DB}$. Consequently, there is no such a matter that a large current of the sense amplifier enabling signal SAP in FIG. 3 flows through PMOS 34 into the sense amplifier 30, NMOS 44 in the column address decoder 40 and NMOS's 103 and 104 in the first discharge circuit 100 in the data bus clamping circuit to the earth potential VSS. That is, since NMOS's 103 and 104 are designed to provide small mutual conductance gm1 (in other word, turn-on resistance is large), it is possible to prevent a large current from flowing, thereby reducing a consumption current and also avoiding affection such as deterioration of the transistors.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention. For example, there are considered the following modifications.

(1) Although each of the first and second discharge circuits 100 and 110 comprises two series connected NMOS's connected to the data bus DB and an additional two series connected NMOS's connected to the data bus $\overline{DB}$, it is possible to replace the number of NMOS's by other number such as three. Further, it is possible to replace NMOS's by other transistors such as PMOS's by changing a polarity of the power supply potential.

(1) The control circuit 120 may be constructed with a circuit other than that shown in FIG. 1. For example, it may be so constructed that the row address latch signal RAS is entered to one of two input terminals of a NAND gate, the column address decoder enabling signal YDE in entered through an inverter to the other input terminal of the NAND gate, and an output of the NAND gate is inverted by an inverter, so that the clamp signal CLP is produced.

(3) The semiconductor memory device is not restricted in structure to the embodiment shown in FIG. 2, and the circuits of the respective blocks in FIG. 2 are also not restricted in circuit structure to the ones shown in FIGS. 3A through 4B and may be modified with other circuit structure using other transistors.

What is claimed is:

1. A semiconductor memory device comprising:
a memory cell array;
a row address decoder coupled to said memory cell array through a plurality of word lines, said row address decoder selecting a word line in response to a row address strobe signal;
a column address decoder coupled to a data bus and to said memory cell array through a plurality of bit lines, said column address decoder transferring data on the bit lines to the data bus in response to a column address decoder enabling signal;
a control circuit for generating a control signal at first and second levels in response to the row address strobe signal and the column address decoder enabling signal, respectively;
a first clamping circuit coupled to the data bus for changing a level on the data bus to a third level in response to the control signal; and
a second clamping circuit coupled to the data bus for changing the level on the data bus to the third level in response to the control signal, said second clamping circuit having a level changing ability higher than that of said first clamping circuit.

2. A device according to claim 1, wherein said first and second clamping circuits change the level on the data bus when the control signal is at the first level.

3. A device according to claim 2, wherein said control circuit continues to produce the control signal at the first level in response to said row address decoder starting to latch the data until immediately before said column address decoder transfers the second signal on the bit line to the data bus.

4. A device according to claim 1, wherein the first and second levels re high voltage and ground levels, respectively.

5. A device according to claim 1, wherein the third level is a ground level.

6. A device according to claim 1, further comprising a sense amplifier coupled between said memory cell array and said column address decoder.

7. A device according to claim 1, further comprising a differential amplification type of readout circuit coupled to the data bus.

8. A semiconductor memory device comprising:
a memory cell array having a plurality of pairs of bit lines and a plurality of word lines;
a row address decoder coupled to the word lines, said row address decoder selecting a word line in response to a first signal;
a column address decoder coupled to the plurality of pairs of bit lines and to a pair of data buses, said column address decoder transferring data on a predetermined pair of the plurality of pairs of bit lines to the pair of data buses in response to a second signal generated from the first signal;
a control circuit for generating a control signal at first and second levels in response to the first and second signals, respectively;
a first clamping circuit connected to the data buses for changing a level on the data bus to a third level in response to the control signal; and
a second clamping circuit coupled to the data buses for changing the level on the data bus to the third level in response to the control signal, said second clamping circuit having a level changing ability higher than that of said first clamping circuit.

9. A device according to claim 8, wherein said first and second clamping circuits change the level on the data buses when the control signal is at the first level.

10. A device according to claim 9, wherein said control circuit produces the control signal in the first level when said row address decoder latches the data and said column address decoder does not transfer the second signal on the predetermined pair of bit lines to the data buses.

11. A device according to claim 8, wherein the first and second levels are high voltage and ground levels, respectively.

12. A device according to claim 8, wherein the third level is a ground level.

13. A device according to claim 8, wherein the first signal is a row address latch signal and the second signal is a column address decoder enabling signal.

14. A device according to claim 8, further comprising a sense amplifier coupled to bit lines and between said memory cell array and said column address decoder for amplifying difference of levels on the pair of bit lines.

15. A device according to claim 8, further comprising a differential amplification type of readout circuit coupled to the data bus for amplifying difference of levels on the pair of data buses.

* * * * *